United States Patent [19]

Oda

[11] 3,984,773
[45] Oct. 5, 1976

[54] PULSE COUNTING-RATE METER

[75] Inventor: Minoru Oda, Amagasaki, Japan

[73] Assignee: Mitsubishi Denki Kabushiki Kaisha, Tokyo, Japan

[22] Filed: June 6, 1974

[21] Appl. No.: 477,162

[52] U.S. Cl. .............................. 324/166; 324/78 J; 307/235 T
[51] Int. Cl.[2] ..................... G01P 3/48; G01R 23/02
[58] Field of Search ................. 324/163, 166, 78 J, 324/78 R, 78 E, 173, 174, 175, 78 D; 307/233, 235 T

[56] References Cited
UNITED STATES PATENTS
3,601,707  8/1971  Bauer .............................. 324/78 J OTHER PUBLICATIONS
Abbott, R.W. "Vibration Frequency Monitor", Western Electric Technical Digest No. 7, July 1967, p. 39.

*Primary Examiner*—Alfred E. Smith
*Assistant Examiner*—Rolf Hille
*Attorney, Agent, or Firm*—Wenderoth, Lind & Ponack

[57] ABSTRACT

The disclosed meter comprises a pulse shaper circuit for forming each input pulse into a voltage pulse having a predetermined pulsewidth, a level control circuit connected to the pulse shaper circuit to produce a voltage including a dc component providing a measure of the frequency of the input pulses, and a low-pass filter dc coupled to the level control circuit. The filter consists of a series resistor, a parallel capacitor and a series feedback type operational amplifier to extract the dc component from the voltage from the level control circuit.

2 Claims, 5 Drawing Figures

PULSE COUNTING-RATE METER

BACKGROUND OF THE INVENTION

This invention relates to improvements in a pulse counting-rate meter for use in radioactive measurements or the like and more particularly to a pulse counting-rate meter having a high time constant and high accuracy.

Conventional counting-rate meters for use in radioactive measurements or the like have been of the type in which an electric charge having a predetermined magnitude is supplied to a parallel circuit including a resistor and a capacitor for each input pulse to develop a voltage across the resistor due to the mean current for the supplied charges which voltage is measured. In that type of counting-rate meter the resistor has been the element which determines the system sensitivity, and therefore the accuracy of measurement has been limited by the stability of the magnitude of resistance of that resistor. In the radioactive measurements it is required to increase the time constant as determined by a resistor and a capacitor such as above described in order to decrease the statistical error, and accordingly high resistance elements have been inevitably employed. This is because plastic film type capacitors having a high capacitance and low in leakage current is not commercially available. Although a high resistance of magnitude of about $10^9$ ohms is required to be used in order to provide a time constant of from about 1 to 10 minutes, such resistors can only have a stability of resistance magnitude of at most 1%. Thus counting-rate meters including such resistors can only have an accuracy of measurement on the order of at most 1%.

Accordingly it is an object of the present invention to provide a new and improved counting-rate meter having both a time constant and high accuracy wherein the disadvantages of the prior art meters are eliminated.

SUMMARY OF THE INVENTION

The present invention provides a pulse counting-rate meter comprising, in combination, a pulse shaper circuit a level control circuit connected to the pulse shaper circuit, and a low-pass filter connected in direct-current coupled relationship with the level control circuit and consisting of a series resistor, a parallel capacitor and a series feedback type amplifier having a high input impedance.

BRIEF DESCRIPTION OF THE DRAWING

The present invention will become more readily apparent from the following detailed description taken in conjunction with the accompanying drawing in which.

DESCRIPTION OF THE PREFERRED EMBODIMENTS

Figure 1:
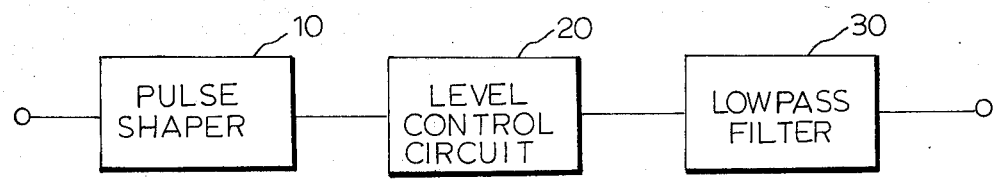
FIG. 1 is a block diagram of a pulse counting-rate meter constructed in accordance with the principles of the present invention.

Referring now to the drawing and FIG. 1 in particular, it is seen that an arrangement disclosed herein comprises a pulse shaper circuit 10, a level control circuit 20 and a low-pass filter 30 connected in series circuit relationship and in the named order. The pulse shaper circuit 10 serves to form each input pulse applied thereto into a voltage pulse having a predetermined pulsewidth. The voltage pulse outputted from pulse shaper circuit 10 is applied to the level control circuit 20 which, in turn, renders the output pulse from the pulse shaper circuit 10 equal to a predetermined magnitude thereby to provide an output pulse having the product of a voltage and time maintained at a predetermined magnitude. The level control circuit 20 is further operative to exactly determine a null output level. In this way the level control circuit 20 produces an output voltage including a dc component exactly proportional to the frequency of the input pulses.

Figures 2A, 2B:
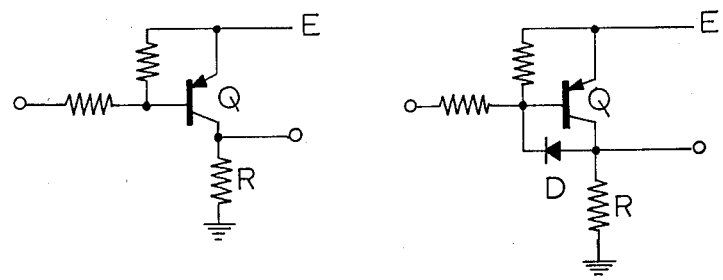
FIGS. 2a and 2b are circuit diagrams of different embodiments of the level control circuit shown in FIG. 1.

FIG. 2a shows one form of the level control circuit 20 constructed in accordance with the principles of the present invention. In FIG. 2a the level control circuit 20 is shown as including a transistor Q having a base electrode connected to the input thereof through a resistor, a collector electrode connected to ground through a resistor R, and an emitter electrode connected to a source of voltage E and also to the base electrode through another resistor. The circuit has an output connected to the junction of the resistor R and the collector electrode of the transistor Q.

The level control circuit 20 has a high level of output potential as determined by the emitter-to-collector saturation voltage of the transistor Q and a low level of output potential or a null output level as determined by the collector base saturation current Icbo of the transistor Q. The emitter-to-collector saturation voltage is normally of scores millivolts and may change in a range of several millivolts. This means that a high accuracy of 0.1% or less can result with respect to a source voltage of 10 volts. On the other hand, a collector base saturation current under 1 nano ampere can readily be provided by existing silicon transistors. Assuming that the resistor R has a magnitude of resistance a the order of 1 kilohm, an error voltage appearing across the resistor R will be $10^{-6}$ volt or less. Therefore the stability can readily be about $10^{-7}$ with respect to the source voltage as above described.

FIG. 2b shows a modification of the level control circuit 20. The arrangement illustrated is different from that shown in FIG. 2a only in that a clamping diode D is connected across the base and collector electrodes of the transistor Q. The clamping diode D is operative to decrease the switching time. Thus the arrangement of FIG. 2b is suitable for use in measuring high counting rates.

Referring back to FIG. 1, the low-pass filter 30 is put in direct-current coupled relationship with the level control circuit 20 and is operative to smooth the output voltage from the level control circuit 20 and extract a dc component of the smoothed voltage giving a measure of the frequency of the input pulses applied to the pulse shaper circuit 10.

Figures 3A, 3B:
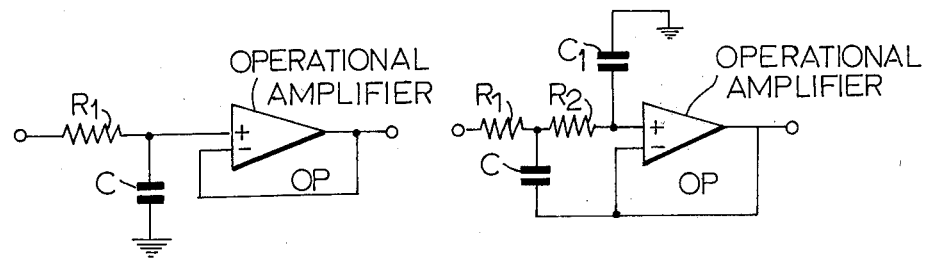
FIGS. 3a and 3b are circuit diagrams of different embodiments of the low-pass filter shown in FIG. 1.

The low-pass filter 30 can be preferably formed in a circuit configuration as shown in FIGS. 3a or 3b. In FIG. 3a the low-pass filter 30 is shown as including an operational amplifier OP having a positive input connected to the input to the filter through a series resistor $R_1$ and also to ground through a parallel capacitor C and a negative input connected to the output thereof. Thus the low-pass filter is composed of a series feedback type amplifier having a high input impedance. The output of the amplifier OP is connected to the output of the low-pass filter.

The arrangement as illustrated in FIG. 3b is substantially similar to that shown in FIG. 3a excepting that the operational amplifier OR has the positive input connected to the series resistor $R_1$ through another series resistor $R_2$ and also to ground through a parallel capacitor $C_1$ and the negative input is further connected to the parallel capacitor C.

As seen in FIGS. 3a and 3b, the low-pass filter should be of the type wherein the resistor included in the time constant circuit has no direct current flowing therethrough. Also an amplifier in the form of a follower or a follower with a gain used in conjunction with the low-pass filter as above described must be sufficiently low in offsetting of voltage and current. Operational amplifiers available can readily give an error due to the offsetting on the order of 0.1%.

From the foregoing it will be appreciated that the present invention includes in a time constant circuit a high resistor contributing only to the smoothing operation but not forming an element for determining the sensitivity. Therefore a change in the magnitude of resistance thereof brings about only a variation in the time constant but does not cause any error in the output voltage. A slight variation in the time constant does not injure operation of the counting-rate meters for practical purposes.

Also from the foregoing it will be appreciated that the present invention has provided a counting-rate meter having a high time constant corresponding to a time interval of from 1 to 10 minutes and an accuracy measurement of 0.1% or less.

While the present invention has been illustrated and described in conjunction with a few preferred embodiments thereof it is to be understood that various changes and modifications may be resorted to without departing from the spirit and scope of the present invention.

What is claimed is:

1. A pulse counting-rate meter comprising, in combination, a pulse shaper circuit, a level control circuit connected to said pulse shaper circuit and including a transistor having a high output level as determined by the emitter-to-collector saturation voltage thereof, and a low output level as determined by the collector base saturation current thereof, and a low-pass filter connected in direct-current coupled relationship with said level control circuit and consisting of a series resistor, a parallel capacitor and a series feedback type amplifier having a high input impedance.

2. A pulse counting-rate meter as claimed in claim 1, wherein said transistor includes a base electrode and a collector electrode having a clamping diode connected thereacross.

* * * * *